United States Patent [19]

Brickerd, Jr.

[11] 4,006,309
[45] Feb. 1, 1977

[54] VOICE OPERATED RELAY

[75] Inventor: Millard S. Brickerd, Jr., Panama City, Fla.

[73] Assignee: The United States of America as represented by the Secretary of the Navy, Washington, D.C.

[22] Filed: Oct. 20, 1975

[21] Appl. No.: 624,208

[52] U.S. Cl. .............................................. 179/1 VC
[51] Int. Cl.² ........................................ H03F 3/72
[58] Field of Search ............ 179/1 A, 1 VC, 1 VL, 179/1 D, 1 R; 325/397–415; 360/96

[56] References Cited

UNITED STATES PATENTS

| | | | |
|---|---|---|---|
| 2,343,471 | 3/1944 | Nixon | 179/1 G |
| 2,646,465 | 7/1953 | Davis | 179/1 VC |
| 3,079,463 | 2/1963 | Feldman | 179/1 G |
| 3,270,216 | 8/1966 | Dersch | 179/1 VC |
| 3,332,021 | 7/1967 | Hedlund | 325/402 |
| 3,569,840 | 3/1971 | Tanaka | 325/402 |
| 3,730,995 | 5/1973 | Mathews | 179/1 VC |
| 3,746,789 | 7/1973 | Alcivar | 179/1 VC |
| 3,821,649 | 2/1973 | Grosjean | 325/398 |
| 3,873,926 | 3/1975 | Wright | 179/1 VC |
| 3,924,070 | 12/1975 | Seaver | 179/1 VC |

*Primary Examiner*—Kathleen H. Claffy
*Assistant Examiner*—E. S. Kemeny
*Attorney, Agent, or Firm*—Richard S. Sciascia; Don D. Doty; Harvey A. David

[57] ABSTRACT

A voice operated relay system is disclosed which includes signal processing circuitry for receiving and discriminating with respect to human speech signals and for actuating a relay in response thereto. A power supply test is also included, as well as circuitry for preventing relay drop out due to input speech hesitations. The preferred embodiment of the subject system is disclosed as a means of enabling a cassette recorder and for causing it to record said human speech signals at either near or remote locations.

2 Claims, 1 Drawing Figure

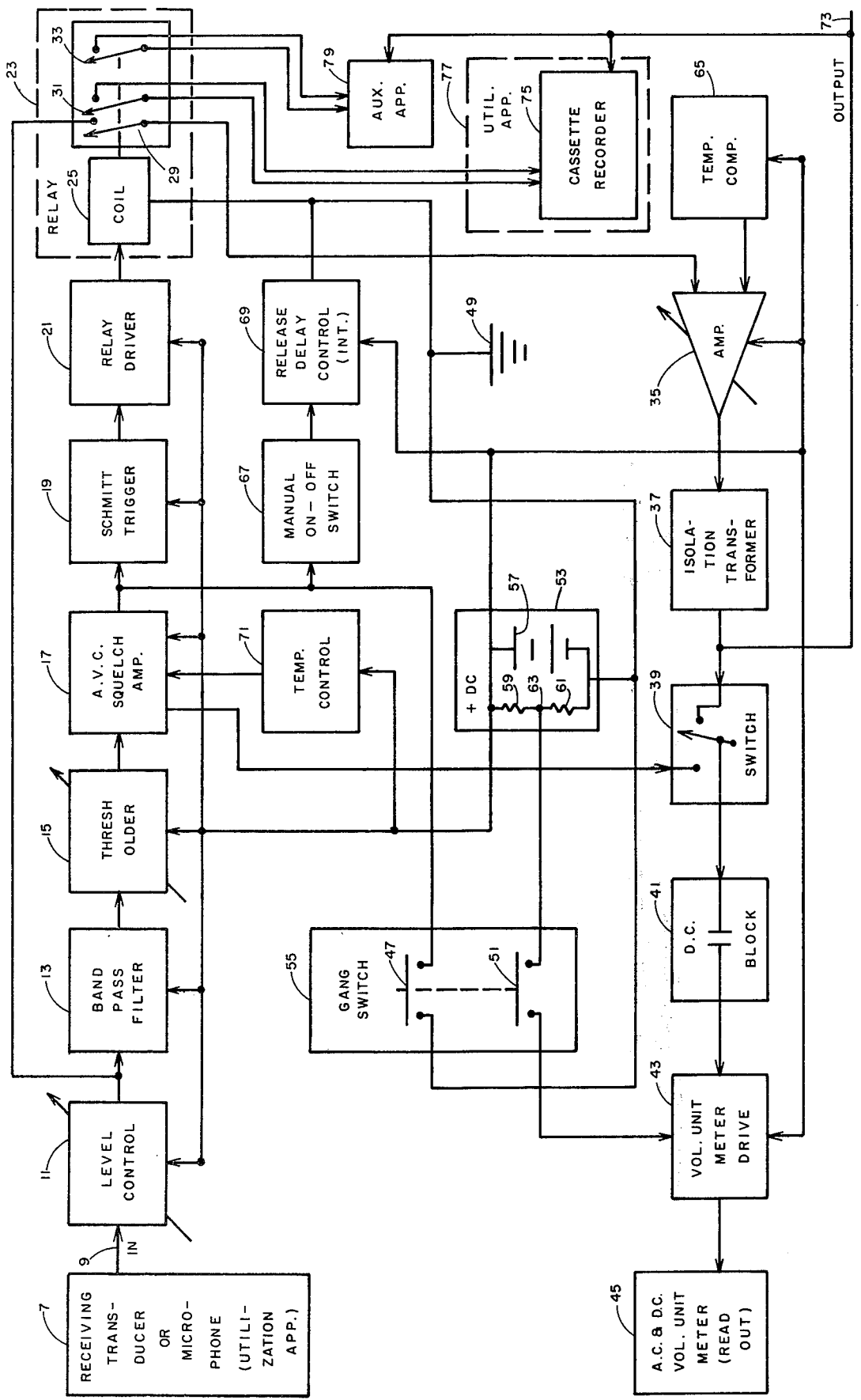

4,006,309

VOICE OPERATED RELAY

STATEMENT OF GOVERNMENT INTEREST

The invention described herein may be manufactured and used by or for the Government of the United States of America for governmental purposes without the payment of any royalties thereon or therefor.

FIELD OF THE INVENTION

The present invention relates, in general, to communication control circuits and, in particular, is an automatic apparatus enabling system that operates in response to a predetermined signal supplied thereto. In even greater particularity, the subject invention comprises a voice operated relay system that activates the receiving mode of a cassette recorder upon receipt of human speech signals.

DESCRIPTION OF THE PRIOR ART

While undoubtedly useful for their intended purposes, the voice activated systems of the prior art are, for the most part, unwieldy, not portable in the usual sense, less sensitive than is desirable, more complex in structure, and, to some extent, they are less responsive to their intended actuating signal. Moreover, as a general rule, their delay on actuation is sufficient to ordinarily result in the clipping of the beginning syllable of the actuating signal, thereby making the use of a voice operated relay quite evident and, perhaps, causing a distorted apparatus actuation signal to occur. In the event such prior art was used to enable a voice or other recording means, such operational delays could reduce the fidelity thereof or the communicative aspect thereof to the extent that they might be of considerably less value than they should be.

SUMMARY OF THE INVENTION

The instant invention overcomes many of the disadvantages of the prior art, in that it is easily handled, operated, and maintained; it is self-contained and portable; and its response accuracy is improved. Furthermore, it is versatile from both the operation and application standpoints.

It is, therefore, an object of this invention to provide an improved voice operated relay system.

Another object of this invention is to provide an improved method and means of enabling a predetermined apparatus in response to a predetermined input signal.

Still another object of this invention is to provide an improved method and means of monitoring and recording incoming communications and other signals.

A further object is to provide an improved method and means for enabling a cassette recorder and other recording apparatus.

Another object of this invention is to provide an improved method and means for automating the sequencing of equipment in response to magnetic taped control signals.

Other objects and many of the attendant advantages will be readily appreciated as the subject invention becomes better understood by reference to the following detailed description, when considered in conjunction with the accompanying drawings.

BRIEF DESCRIPTION OF THE DRAWING

FIG. 1, the sole FIGURE of the drawing, discloses the system constituting the instant invention in block diagram form.

DESCRIPTION OF THE PREFERRED EMBODIMENT

Referring now to FIG. 1, there is shown a utilization apparatus 7 which constitutes whatever equipment will supply a signal to the invention, in order to enable or actuate another utilization by an output signal therefrom, the latter of which will be discussed more fully subsequently. For example, utilization apparatus 7 may be a receiving transducer that converts any predetermined parameter to an electrical signal that is proportional, comparable, or analog thereto. Even more specifically, it may be a microphone which converts human speech or other acoustical signals into electrical signals proportional thereto.

From the foregoing and from the disclosure of the preferred embodiment of the invention presented herewith, it may readily be seen that the subject invention is primarily intended to be voice operated; nevertheless, it should be understood that its utility is considerably greater than that of just being a voice operated or actuated device. However, for the purpose of keeping tis disclosure as simple as possible, this the voice operated characteristics will be discussed in detail herein. Obviously, it would be well within the purview of one skilled in the art having the benefit of the teachings presented herewith to make whatever design changes as would be necessary for the subject to be useful in many different operational situations and, therefore, responsive to many other input parameters.

The output of microphone 7 is connected to an input terminal 9, which for most practical purposes, constitutes the input to the instant voice operated relay, and said terminal 9 is likewise connected to the input of an adjustable signal level control 11, which may be an adjustable amplifier, cathode follower equivalent, or the like.

The output of adjustable level control 11 is connected through a predetermined bandpass filter and an adjustable thresholder 15 to the input of an automatic volume control (A.V.C.) squelch amplifier 17, with the DC trigger output thereof connected to the input of a Schmitt trigger 19.

A.V.C. squelch amplifier 17 may be of any conventional type, of course; however, it has been found that Model LM270 thereof, manufactured by the National Semiconductor Corporation of 2900 Semiconductor Dr., Santa Clara, Cal., and containing a rectifier in one of the outputs thereof, so as to produce a D.C. trigger pulse at said one output. In other words, in this particular instance, and for reasons which will be made more clear later on, automatic volume control squelch amplifier 17 is preferably designed so that no trigger output signal will occur when a data signal is present at the input thereof, and when no data signal is present at the input thereof a rectified or direct current (D.C.) signal will occur at the trigger output thereof. Of course, said Schmitt trigger 19 should be tailored so as to produce an output signal whenever no signal is being supplied to the input thereof by the aforesaid automatic volume control squelch amplifier.

The output of Schmitt trigger 19 is connected through a relay driver 21 to a multiswitch relay 23 containing a relay coil 25 and any required number of switches that are closed (or opened) simultaneously, as a result of the energization of the aforesaid relay coil 25, as is conventional in the relay art.

In this particular case, relay actuator coil 25 is connected to a predetermined plurality of switches, such as, for instance, switches 29, 31, and 33, each of which is an open-close switch of the single pole-single throw type.

The contact of switch 29 is connected to the output of the aforementioned adjustable gain control 11, and switch 31 is connected to one or more auxiliary utilization apparatus, which, of course, may include any equipment that is compatible with the subject invention, as far as the enabling or disabling thereof by means of a voice or other input signal is concerned.

The movable arm of switch 29 is connected to the input of an adjustable amplifier 35, the output of which is connected through an isolation transformer 37 to one of the contacts of a selector switch 39, the other contact of which is connected to amplification or data output of the aforementioned automatic volume control squelch amplifier 17. The movable arm of selector switch 39 is connected to one of the plates of a direct current (D.C.) blocking capacitor 41, the other plate of which is connected to the input of a volume unit meter drive 43, the output of which is connected to the input of an alternating current (A.C.) and direct current (D.C.) volume unit meter 45 or other suitable readout, as appropriate for any given operational circumstances.

The trigger output of the aforementioned automatic volume control squelch amplifier 17 is also connected to one of the terminals of a switch 47, the other terminal of which is connected to a ground 49. One of the terminals of another switch 51 is connected to a predetermined direct current (D.C.) source 53, the other terminal of which is connected to the input of the aforesaid volume unit meter derive 43.

As may readily be seen in FIG. 1, switches 47 and 51 are ganged together for simultaneous operation, thereby forming gang switch 55. The operation thereof is preferably by manual means, but, of course, it may be operated by any other suitable means, if so desired.

The preferred embodiment of D.C. voltage source 53 has been determined to be a battery 57 connected in parallel with a pair of series connected resistors 59 and 61, the common terminal 63 of which is connected to one of the terminals of switch 51.

Optionally, but preferably, amplifier 35 is temperature compensated, so as to prevent an operational change within the invention as a result of a change in the temperature ambient thereto. For such purpose, a conventional temperature compensator 65 is connected thereto.

The trigger output of A.V.C. squelch amplifier 17 is connected through a manually operated on-off switch 67 to the input of an RC integrator type release delay control 69, with the output thereof connected to ground. As a result, when switch 67 is closed, relay coil 25 remains energized for a predetermined period of time following application of the output trigger signal from A.V.C. squalch amplifier 17, even though the output trigger signal from A.V.C. squelch amplifier 17 has ceased, as will be discussed more fully subsequently during the discussion of the operation of the invention.

Like the aforementioned amplifier 35, A.V.C. squelch amplifier may be temperature compensated, if so desired. Hence, temperature compensator 71 is connected thereto for such purpose.

The output of isolation transformer 37 also constitutes the amplified voice output of the subject invention. Hence, it is connected to an output terminal 73 and to the input of a cassette recorder 75, in this particular disclosure. Of course, cassette recorder 75 happens to be the apparatus desired to be voice actuated at this time; therefore, it constitutes an output utilization apparatus 77 of a particular type, whch is also connected to the aforementioned switch 31 to be turned on and off thereby. Nevertheless, the aforesaid output terminal may be effectively connected to the input of any other suitable utilization apparatus 79, if so desired, or it may be connected to a plurality of such apparatus (not shown) if warranted by operational circumstances. Obviously, the artisan would be able to choose whatever devices could best be used as utilization apparatus 77 and 79 without violating the spirit or scope of the invention.

From the foregoing, it may be seen that both input and output utilization apparatus 11 and 77 should be considered as being almost unlimited, even though, as will be discussed more fully later, the instant invention was primarily made originally for the purpose of making a cassette recorder become operable in the recording mode by the presence of a human voice.

At this time, it would perhaps be worthwhile to note that all of the elements shown in book form in FIG. 1 are well known and commercially available, per se; accordingly, it is their new and unique interconnections and interactions that make them constitute a new combination of elements and produce the new and improved results effected thereby.

Because the subject invention is battery powered in order to increase its portability, the positive terminal of battery 57 supplies a predetermined positive D.C. voltage to all of the components requiring such power; consequently, it is shown as being connected to level control 11, bandpass filter 13, thresholder 15, A.V.C. squelch amplifier 17, Schmitt trigger 19, relay driver 21 and indirectly to coil 25, release delay control 69, temperature controls 65 and 71, amplifier 35, and volume unit meter 43, as well as any other elements of the invention determined to require such power by the artisan.

MODE OF OPERATION

The operation of the invention will now be discussed briefly in conjunction with FIG. 1 of the drawing.

On numerous occasions, it is desirable to enable or activate some particular apparatus or equipment by means of some predetermined signal other than electrically turning it on manually. Furthermore, it is often desirable to have the enabling thereof occur automatically in response to human speech or other signals, acoustical or otherwise. For example, in the event it is desirable to have voice recording apparatus inactive at such times as human speech signals are not supplied thereto—say, in order to conserve battery or other power—and operative when they are supplied thereto, it becomes necessary to associate apparatus therewith which recognizes such speech signals and takes the proper action automatically to turn said recording apparatus on and record or playback, as warranted by operational circumstances. The subject invention constitutes just such associate apparatus.

Although as previously indicated, the invention may be made or designed to be responsive to numerous incoming signals merely by selecting the proper receiving transducer and signal processing elements—such as, filters, thresholders, amplifiers, and the like—as sociated therewith, the preferred embodiment of the invention discussed herewith will be considered as being a voice operated relay which is responsive to human speech signals for the purpose of automatically activating a cassette recorder to record said speech signals. Again, however, it should be understood, as previously suggested, that any properly designed auxiliary utilization apparatus may be combined with or substituted for said cassette recorder, if so desired.

Hence, in the instant preferred embodiment, microphone 7 receives human voice signals and converts them to electrical signals proportional thereto, which are then controlled to an optimum operational level by level control 11. As will be discussed again subsequently, said properly level controlled electrical signals will ultimately become the signals that are recorded by cassette recorder 75, after which they may be played back at the discretion of an operator as human voice signals for communication or other purposes.

When properly designed in the conventional manner, bandpass filter 13 permits said voice signals to pass therethrough with a minimum of spurious signals, so as to reduce the probability of the cassette recorder being untimely activated by source, medium, or circuit noise or other spurious signals that may happen to be combined therewith at any given time. To insure that the resulting data signal is of sufficient amplitude to warrant further processing, it is thresholded, after which it is automatic gain controlled by A.V.C. squelch amplifier 17. Of course, in the event a proper or desired signal has not been presented to the input of A.V.C. squelch amplifier 17, whatever signal—spurious noise or the like—that happens to be there is squelched so that no output signal emanates therefrom at that time. This, of course, prevents the subsequent recording of such unwanted signal by cassette recorder 75.

The subject A.V.C. squelch amplifier 17 is designed to produce a properly amplified data signal at one of the outputs thereof when an input signal thereto is present and a D.C. trigger signal at another output thereof whenever no signal is present at the input thereof. The aforesaid amplified data signal is supplied to one of the electrical contacts of selector switch 39 for timely selection thereof for purposes which will be explained more fully below, and, when present, said D.C. trigger signal is supplied to Schmitt trigger 19, so that it will, in turn, effectively provide stable actuation of relay 23 through relay driver 21 over a wide range of power fluctuation. Obviously, driver 21 was employed to control the power which energizes coil 25 of relay 23, so that it will be adequate therefor.

When coil 25 is energized, switches 29 and 31 (and any other switches that happen to be ganged therewith) will be closed. Considering switch 29 first, when it is closed, the speech signals from level control 11 are coupled to the data input of amplifier 35, where they are suitably amplified passed through isolation transformer 37, and supplied to the recorder input of cassette recorder 75. Of course, cassette recorder 75 must be turned on before it can record. Such operation is implemented by switch 31 which is located in the on-off circuit thereof. Hence, when switches 29 and 31 are closed, cassette 75 is turned on and the speech signal to be recorded is supplied thereto almost immediately thereafter. If so desired, said switches 27 may be so designed that switch 31 closes an instant before switch 29 closes, thereby insuring that cassette recorder is on when the speech signal is supplied thereto.

In order to insure proper operation of the entire invention, it has been found to be desirable to test the battery power before use thereof is attempted and, on occasions, before the invention is transported to some remote place where new batteries are not available. To facilitate the making of such test, a test circuit has been uniquely combined with the remainder of the elements of the invention. Hence, the switches of ganged switch 55 are closed, thereby causing the aforesaid trigger 55 to be grounded and a predetermined analog signal voltage that is proportional to the supply voltage of battery 58 to be applied to volume unit meter drive 43 which, in turn, causes it to be read out by A.C. and D.C. volume unit meter 45. Obviously, if said meter reading is too low, battery 57 is replaced, preferably at a place where the supply thereof is readily available. Furthermore, the foregoing test procedure may be used to calibrate the readout circuit, if and when the output voltage is known as a result of being tested by some other testing means—such as, for example, a D.C. voltmeter.

During a normal speech recording situation, it has been ascertained that the speaker sometimes hesitates between words, sentences, or the like. Consequently, to compensate for such breaking of the input signal—which, in turn, would cause intermittant and sometimes almost constant dropping in and dropping out of coil 25 of relay 23—the aforementioned release delay control 69 is incorporated in the invention. Very simply, it is an integrator that has an R.C. time constant that may be varied as desired by a human operator to be from 0 to 5 seconds. Of course, said integrator 69 is made operative by the manual closing of switch 67 in series therewith. Although numerous designs therefor would perhaps come to the mind of the artisan having the benefit of the teachings presented herewith, in the instant case (remembering that coil 25 is energized only when a trigger signal is not present at the input of Schmitt trigger 19 as a consequence of speech signals being received by microphone 7) it should be seen that it takes the voltage a short while to build up in integrator 69 (depending upon the time constant selected); hence, there is a delay until the input trigger voltage reaches that which will cause Schmitt trigger 19 to change state, thereby effectively making it a slow follower and preventing the deenergization of coil 25 during the aforesaid short speech hesitations. Obviously, if rapid following of speech input and no speech input is desired, switch 67 is turned off, thereby taking release delay control 69 out of the subject system.

Although casette recorder 75 constitutes utilization apparatus 77 in this discussion of the invention, auxiliary apparatus 79 may be actuated by switch 33 and have its data input connected to the output of isolation transformer 37, too; moreover, output terminal 73 may also be connected to the input of any other utilization equipment that is compatible with the subject invention, even though it is not disclosed at this time.

In view of the foregoing, it may readily be seen that the instant invention produces a highly useful result in a new and unique manner, and, therefore, it constitutes a considerable advancement in the voice actuated apparatus art.

Obviously, other modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. A voice operated relay system for controlling the actuation of, and data signal input to, utilization means having an actuation signal input connection and a data signal input connection, said system comprising:
   input means for providing an audio frequency data signal;
   an adjustable level control means, connected to said input means, for selectively attenuating said data signal to provide a level controlled data signal;
   an adjustable gain output amplifier having its output connected to said data signal input connection of said utilization means;
   relay means having first switch means for connecting a voltage source to said actuation signal connection of said utilization means, and having second switch means for connecting a portion of said level controlled data signal to said adjustable gain output amplifier;
   bandpass filter means, connected to receive a portion of said level controlled data signal, for passing a level controlled and bandpass filtered signal;
   adjustable threshold means, connected to said bandpass filter means and operative to pass only filtered signals exceeding a predetermined amplitude, for selectively adjusting the sensitivity of said system;
   automatic gain control squelch amplifier means, connected to said threshold means and responsive to the signals passed thereby to provide automatic gain controlled signals as first and second outputs each corresponding to said signals passed by said threshold means;
   Schmitt trigger means, responsive to said first output of said automatic gain control squelch amplifier means, for controlling actuation of said relay means;
   a meter; and
   a selector switch connected to said meter and operative between first and second positions to alternatively connect said meter to said second output of said automatic gain control squelch amplifier and to a portion of said output of said adjustable gain output amplifier;
   whereby with said selector switch in one position said meter can be used in conjunction with said level control means and with said adjustable threshold means, and with said selector switch in the other position said meter can be used in conjunction with said adjustable gain amplifier.

2. A voice controlled relay system as defined in claim 1 and further comprising:
   gang switch means including third switch means for connecting said first output of said automatic gain control squelch amplifier to ground, and fourth switch means for connecting said meter to said voltage source, whereby upon actuation of said gang switch, said meter indicates the strength of said voltage source.

* * * * *